United States Patent
Bittner

(10) Patent No.: US 9,423,696 B2
(45) Date of Patent: Aug. 23, 2016

(54) PROJECTION EXPOSURE APPARATUS WITH OPTIMIZED ADJUSTMENT POSSIBILITY

(71) Applicant: Carl Zeiss SMT GmbH, Oberkochen (DE)

(72) Inventor: Boris Bittner, Roth (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 437 days.

(21) Appl. No.: 13/850,400

(22) Filed: Mar. 26, 2013

(65) Prior Publication Data

US 2013/0250266 A1 Sep. 26, 2013

Related U.S. Application Data

(63) Continuation of application No. PCT/EP2011/063875, filed on Aug. 11, 2011.

(60) Provisional application No. 61/387,154, filed on Sep. 28, 2010.

(30) Foreign Application Priority Data

Sep. 28, 2010 (DE) .................. 10 2010 041 528

(51) Int. Cl.
*G03B 27/42* (2006.01)
*G03F 7/20* (2006.01)

(52) U.S. Cl.
CPC ............ *G03F 7/70191* (2013.01); *G03F 7/705* (2013.01); *G03F 7/70266* (2013.01); *G03F 7/70891* (2013.01)

(58) Field of Classification Search
CPC .......... G01S 11/12; G01S 17/89; G01S 17/46; G01S 17/875; G01S 7/497; G01S 11/06
See application file for complete search history.

(56) References Cited

U.S. PATENT DOCUMENTS

| | | |
|---|---|---|
| 5,390,228 A | 2/1995 | Niibe et al. |
| 6,065,842 A | 5/2000 | Fink |
| 6,198,519 B1 | 3/2001 | Rupp |
| 6,521,877 B1 | 2/2003 | Mueller-Rissmann et al. |
| 7,570,345 B2 | 8/2009 | Reisinger et al. |
| 8,203,696 B2 | 6/2012 | Bittner et al. |
| 2008/0002167 A1 | 1/2008 | Gruner et al. |
| 2008/0123066 A1 | 5/2008 | Jansen et al. |
| 2009/0046260 A1 | 2/2009 | Jansen |

(Continued)

FOREIGN PATENT DOCUMENTS

| | | |
|---|---|---|
| DE | 19827602 | 12/1999 |
| DE | 102004035595 | 11/2005 |

(Continued)

OTHER PUBLICATIONS

Japanese Office Action, with translation, for JP Appl No. 20132-530650, dated Feb. 25, 2014.

*Primary Examiner* — Mesfin T Asfaw
(74) *Attorney, Agent, or Firm* — Fish & Richardson P.C.

(57) ABSTRACT

Method for operating a projection exposure apparatus for microlithography, the projection exposure apparatus comprising an optical element, a manipulator, which acts on the optical element by changing the temperature of the optical element and the deflection of which brings about a heat flow caused by the manipulator into the optical element. The history of the effects, in particular the temperatures introduced into the optical element or the optical effects caused thereby, of the manipulator are recorded in a record.

16 Claims, 4 Drawing Sheets

(56) References Cited

U.S. PATENT DOCUMENTS

| | | |
|---|---|---|
| 2009/0257032 A1 | 10/2009 | Eva et al. |
| 2009/0296055 A1* | 12/2009 | Ye et al. .......................... 355/30 |
| 2010/0128367 A1 | 5/2010 | Beckenbach et al. |
| 2010/0201958 A1 | 8/2010 | Hauf et al. |
| 2010/0261120 A1 | 10/2010 | Waldis et al. |

FOREIGN PATENT DOCUMENTS

| | | |
|---|---|---|
| DE | 102008042356 | 4/2010 |
| DE | 102009054869 | 10/2010 |
| EP | 851305 B1 | 4/2004 |
| EP | 1670041 A1 | 6/2006 |
| EP | 1921505 | 5/2008 |
| JP | 2 090510 A | 3/1990 |
| JP | 2001-185483 A | 7/2001 |
| JP | 2002-373857 | 12/2002 |
| JP | 2009-081419 A | 4/2009 |
| WO | 2008034636 | 3/2008 |
| WO | 2008037496 | 4/2008 |
| WO | 2009026970 | 3/2009 |
| WO | WO 2009/148976 | 12/2009 |

* cited by examiner

PROJECTION EXPOSURE APPARATUS WITH OPTIMIZED ADJUSTMENT POSSIBILITY

CROSS-REFERENCE TO RELATED APPLICATIONS

This application is a continuation of, and claims priority under 35 U.S.C. §120 to, International Patent Application Serial Number PCT/EP2011/063875, filed Aug. 11, 2011. International Patent Application Serial Number PCT/EP2011/063875 claims priority under 35 U.S.C. §119(e) to U.S. Patent Application Ser. No. 61/387,154, filed Sep. 28, 2010, and also claims benefit under 35 U.S.C. §119 of German Patent Application No. 10 2010 041528.6, filed on Sep. 28, 2010. The entire disclosure of International Patent Application Serial Number PCT/EP2011/063875 is incorporated by reference into the present application.

FIELD

The invention relates to a method for operating a projection exposure apparatus for microlithography.

Furthermore, the invention relates to a projection exposure apparatus for microlithography.

BACKGROUND

Projection exposure apparatuses for microlithography generally consist of a light source, an illumination system, which processes the light rays emitted by the light source, an object to be projected, generally called reticle or mask, a projection lens, called lens for short hereinafter, which images an object field onto an image field, and a further object, onto which projection is effected, generally called wafer. The reticle or at least one part of the reticle is situated in the object field and the wafer or at least one part of the wafer is situated in the image field. The lens generally defines an optical axis with respect to which the optical elements belonging to the lens are arranged. Generally, the optical elements are rotationally symmetrical with respect to the optical axis and the optical axis is a normal to the object field and image field. The design of the lens is called rotationally symmetrical in this case.

If the reticle is situated approximately completely in the region of the object field, and the wafer is exposed without a relative movement of wafer and image field, then the projection exposure apparatus is generally designated as a wafer stepper. If only a part of the reticle is situated in the region of the object field, and the wafer is exposed during a relative movement of wafer and image field, then the projection exposure apparatus is generally designated as a wafer scanner.

During the exposure of the wafer, the projection exposure apparatus is operated with a predefined aperture and a setting predefined by the illumination system, for example a completely coherent, partly coherent, specifically dipole or quadrupole setting. The aperture is predefined by the illumination system and/or defined by a stop in the lens. Customary image-side apertures for lenses for microlithography are values of between 0.5 and 0.6, or 0.6 and 0.7, or 0.7 and 0.8, or 0.8 and 0.9, or else higher. The setting is generally predefined by optical elements of the illumination system such as, for example, an axicon, a stop or a micromirror array or one or more changeable DOEs (diffractive optical elements). During exposure, from each field point associated with the object field, a maximum light beam trimmed by the aperture stop passes from the object field to the image field. In an ideally manufactured lens, the imaging aberrations of which are determined only by the design of the lens, the wavefront defined by the maximum light beam in the vicinity of the image point associated with the field point approximately corresponds to a spherical wave with the image point as central point. The possible resolution of such a lens is therefore determined by the diffraction orders which still lie within the aperture. Therefore, such lenses are also called diffraction-limited.

If the region between the last optical element of the lens and the wafer is filled with a gas as medium, then the refractive index thereof is generally approximately 1.00 and the above apertures are therefore both geometrical and numerical.

If the region between the last optical element of the lens and the wafer is filled with a liquid as medium, then this is referred to as an immersion lens. One possible immersion liquid is water, which has a refractive index of approximately 1.43. Therefore, the image-side apertures indicated above have to be increased by the factor 1.43 in order to determine the assigned image-side numerical apertures. This therefore results in image-side numerical apertures for immersion lenses of approximately 0.75 to 0.9 or 0.9 to 1.05 or 1.05 to 1.2 or 1.2 to 1.35 or else higher.

The possible resolution R that can be achieved with such a lens for micro lithography is inversely proportional to the numerical aperture NA and proportional to the operating wavelength λ of the lens and a process parameter $k_1$:

$$R = k_1 \frac{\lambda}{NA},$$

where $k_1$ is always at least 0.25. The operating wavelength is generally 365 nm, 248 nm, 193 nm or 13 nm. In the case of 13 nm, the lenses are purely catoptric lenses, that is to say lenses consisting only of mirrors. These are operated in a vacuum with geometrical—and correspondingly numerical—apertures of 0.2 to 0.25 or 0.25 to 0.3 or 0.3 to 0.4 or 0.4 to 0.45 or higher.

Further types of lenses for microlithography are dioptric lenses, that is to say lenses consisting only of lens elements, and catadioptric lenses, that is to say lenses consisting of lens elements and mirrors.

During the operation of the projection exposure apparatus with light having the operating wavelength, changes arise in the optical elements belonging to the lens of the projection exposure apparatus, which lead to, in some instances irreversible, changes in the optical properties of the lens. By way of example, mention shall be made here of compaction, rarefaction and chemically governed changes of possible coatings of the optical elements. Further, irreversible changes are produced by drifts of optical elements in the mounts thereof, the drifts being established with increasing time. Other changes are of a reversible nature such as e.g. lens element heating with the thus implied change in shape and the change in the distribution of the refractive index of the lens element. These lead to time- and location-dependent changes in the optical properties of the lens.

Therefore, lenses for microlithography have been supplemented with an increasing number of manipulation possibilities in the course of their development. These possibilities can be used to counteract the changes in the optical properties of the lens in a controlled manner. Use is made of manipulators which displace, rotate, exchange, deform, heat or cool one or a plurality of optical elements associated with the lens, such as lens elements, mirrors or diffractive optical elements. In particular, aspherized plane plates are provided as exchange elements in the lens. Exchange elements can also be optical elements of a lens which are provided with manipulators. These elements are preferably some of the first and last optical elements of the lens as seen in the direction of light propagation, or some of the optical elements situated in the vicinity of an intermediate image of the lens, or some of the optical elements situated in the vicinity of a pupil plane of the lens. The term vicinity is defined here with the aid of the so-called subaperture ratio. In this respect, cf. WO2008034636A2, for example, which is hereby incorporated within its full scope in this application. In particular pages 41 and 42 therein shall be incorporated within their full scope in this application.

Thus, by way of example, WO2008037496A2 discloses a lens for microlithography containing an optical element to which a multiplicity of forces and/or moments are applied by a manipulator, such that the optical element attains a high local variability with regard to its form.

Manipulators which deform an optical element are distinguished by their particularly fast response behavior. R. K. Tyson: Principles of Adaptive Optics, Academic Press, Inc., ISBN 0.12.705900-8, gives a general introduction to rapidly responding manipulators from the field of telescope technology.

Thus, by way of example, WO2008034636A2 discloses a plane plate in a lens for microlithography. Conductor tracks to which current can be applied are situated in or on the plane plate. In the case of the change in temperature caused thereby, the refractive index of the plane plate can be influenced locally, such that the plane plate has a high local variability with regard to its refractive index.

Thus, by way of example, in WO2009026970A1 the plane plate from WO2008034636A2 is provided with a thermal sink that makes possible a temporal constancy of the spatially averaged temperature of the plate.

Thus, by way of example, EP851305B1 discloses a pair of plane plates, so-called Alvarez plates, in a lens for microlithography. This pair of Alvarez plates has an asphere in each case on the mutually facing surfaces of the plates, the aspheres compensating for one another in terms of their optical effect in a relative zero position of the plates with respect to one another. If one or both of the plates is or are deflected perpendicularly to the optical axis of the lens, then the effect of these Alvarez plates is established.

Thus, by way of example, EP1670041A1 discloses a device which serves for the compensation of image aberrations that are introduced into the lens for microlithography specifically as a result of the absorption of dipole illumination. An optical element situated in a pupil plane of the lens experiences non-rotationally symmetrical heating in the case of dipole illumination. The optical element is subjected to additional light from a second light source, which emits light preferably having a different wavelength from that of the operating wavelength, at least approximately complementarily to the heating. Undesired image aberrations are thereby compensated for, or at least reduced, or converted into other image aberrations, which are qualitatively different from the former. In this case, a first image aberration should be understood as qualitatively different from a second image aberration if the indices of the coefficients—which differ significantly from zero—of the expansions of the image aberrations into Zernike polynomials differ in pairs. For the expansion of an image aberration into Zernike polynomials, cf. DE102008042356A1 and DE102004035595A1.

Thus, by way of example, in DE19827602A1 an optical element is subjected to cold or heat over its circumference via Peltier elements. In this case, specifically in the case of manipulators which apply heat to an optical element, the following effect can be observed: these manipulators are used for correcting image aberrations which arise as a result of the fact that a plurality of optical elements of the lens become heated. In general, in this case an individual optical element to which heat is to be applied is intended to compensate for a plurality of such optical elements that become heated. This has two consequences:

1. Firstly, it is necessary for a relatively high heat to be applied to the optical element in comparison with each individual one of the optical elements to be compensated for. Therefore, the manipulator effect of the optical element to which heat is to be applied can no longer be assumed to be proportional to the deflection thereof.

The term "linear" is used instead of "proportional" below.

2. Secondly, a hysteresis effect is manifested during the compensation: if heat is applied to the optical element at a first position, whereby the heating of a first optical element is intended to be compensated for, and if the optical element is heated at a second location, different from the first location, whereby the heating of a second optical element is intended to be compensated for, then the heat distribution that arises after these two heatings in the optical element, and thus the manipulator effect, is dependent on the temporal order in which these two locations are heated.

These two effects are not limited to transmissive optical elements, such as lens elements, for example. In the case of mirrors, too, which are used in particular in EUV lenses and have a main body composed of Zerodur or ULE, non-linearity and hysteresis can be observed. Non-linearity and hysteresis arise in the case of the mirrors by virtue of the fact that the magnitude of the surface deformation caused by the heating is directly dependent on the heating, on the one hand, but also influences the gradient thereof, on the other hand, since the coefficient of thermal expansion of a mirror material such as Zerodur or ULE itself is again temperature-dependent.

These two problems, non-linearity and hysteresis, can be combated as follows:

The thermal manipulator from WO2009026970A1 has the advantage over the thermal manipulators from WO2008034636A2, EP1670041A1, and DE19827602A1 of a temporally compensated heat balance caused by its thermal sink. This has the consequence that the thermal manipulator from WO2009026970A1 for small deflections around its temporally and spatially averaged temperature can be assumed to be linear in terms of its optical effects since the latter always vary in a predefined temperature interval that does not change during the history of the manipulator.

In this case, the optical effect of a manipulator, for a predefined deflection of the manipulator, should be understood to mean the difference in the image aberrations of the lens between deflected and non-deflected manipulator. If a standard deflection that is relatively small in comparison with the maximum possible deflection range of the manipulator is predefined, then the optical effect is also designated as the sensitivity of the manipulator. In this case, the deflection of the manipulator is understood to be a vector whose dimension corresponds to the number of degrees of freedom of the manipulator and whose entries describe the intensity of the deflections in the individual dimensions.

By way of example, in EP1670041A1 8 infrared heat sources are directed at a lens element. The deflection can therefore be described as an 8-dimensional vector having entries of heat flows to be set in joules/second, multiplied by the duration of the heat flows of the respective sources in seconds. The image aberrations arising as a result of these heat inputs can be measured or simulated and related to a lens to which heat is not applied. This results in the optical effect of the manipulator.

A further advantage of the thermal manipulator from WO2009026970A1 over the thermal manipulators from WO2008034636A2, EP1670041A1, and DE19827602A1 is its freedom from hysteresis or, to put it another way, its property "to forget". This should be understood to mean the following: the thermal manipulator from WO2009026970A1, in the case of a deflection to be performed, yields an optical effect which is independent of its present deflection state since, in order to attain this deflection state, the total heat introduced into the plane plate by the manipulator has already flowed away again via the thermal sink. Only the spatial relative temperature distribution in the plane plate, which distribution is relevant to the present optical effect, yields the initial temperature distribution for a renewed deflection of the manipulator and the associated renewed redistribution of the temperatures in the plane plate.

By contrast, the thermal manipulators from WO2008034636A2, EP1670041A1, and DE19827602A1 have to be referred to as non-linear and non-forgetting manipulators. The optical element to which heat is applied by the manipulator at a first instant emits heat to its surroundings in an undefined manner. This has the consequence that at a second instant of subsequent application of heat, it is unclear what temperature distribution is currently present in the optical element. On account of the non-linearity of the change in the surface of the optical element, such as, for example, a mirror in the case of EUV, with a use of Zerodur or ULE as mirror material, depending on the temperature, this means that, on the one hand, the optical effect of this new heat input is no longer linearly dependent on the intensity of the deflection; on the other hand, in mirrors and also in other optical elements such as lens elements, for example, the optical effect thereby also becomes dependent on the initial temperature distribution in the optical element, and thus in particular on the history of the manipulator.

It should be emphasized that the non-thermal manipulators mentioned above likewise forget their history.

SUMMARY

The object of the invention is to provide a method for operating a projection exposure apparatus for microlithography which takes account of the abovementioned observations of the non-linearity and non-forgetting of thermal manipulators, such as those from WO2008034636A2, EP1670041A1, or DE19827602A1.

For the sake of clarity, the individual embodiments of the invention are subdivided into formulations below.

Formulation 1. Method for operating a projection exposure apparatus for microlithography, the projection exposure apparatus comprising an optical element, a non-linear manipulator or a non-forgetting manipulator which acts on the optical element, characterized in that the history of the effects of the manipulator is recorded in a record.

Using the method according to formulation 1, the history of the effects of the manipulator is recorded in a record. In this case, the effects can be, on the one hand, the temperature distributions induced by the manipulator in the optical element on which the manipulator acts; on the other hand, the effects can also be understood to be the optical effects brought about by the respective deflections of the manipulator. By reviewing the history, it is possible to deduce the present deflection state of the manipulator, such that the effect of a renewed deflection of the manipulator becomes foreseeable.

Formulation 2. Method for operating a projection exposure apparatus for microlithography, the projection exposure apparatus comprising an optical element, a manipulator, which acts on the optical element by changing the temperature of the optical element and the deflection of which brings about a heat flow into the optical element, characterized in that the history of the effects, in particular the temperatures introduced into the optical element, or the optical effects caused thereby, of the manipulator is recorded in a record.

A method according to Formulation 2 constitutes the method from Formulation 1 on the basis of the example of a manipulator which applies heat to an optical element. If the optical element is a refractive optical element, such as a lens element, for example, the application of heat acts by changing the refractive index of the material of the refractive element and by changing the shape thereof. If the optical element is a mirror, then the application of heat substantially induces a change of shape.

Formulation 3. Method according to Formulation 2, characterized in that the mode of action of the manipulator is based on subjecting the optical element to ohmic heat, or infrared light, or heat caused by a Peltier element, or heat caused by a fluid flow, in particular by a gas flow.

Formulation 3 above discusses the possible procedures for applying heat to an optical element of a projection exposure apparatus for microlithography. Application of ohmic heat can be performed via heating wires, as in WO2008034636 A2. In the case where the optical element is a plane plate or a lens element, it is advantageously possible here to locally change the temperature and thus the refractive index of the substrate of the plane plate or of the lens element. In this case, the diameters of the wires are advantageously kept small enough not to induce any stray light that can no longer be afforded tolerance in the lens of the projection exposure apparatus. By applying infrared light to the optical element, the energy transfer necessary for heating the optical element is advantageously realized in a contactless manner. Such a manipulator can have a large number of degrees of freedom for the deflection of the optical element. Thus, by way of example, EP1670041A1 discloses a manipulator which uses eight optical waveguides to apply infrared light to a lens element. By contrast, the application of heat to an optical element via the voltage regulation of thermally linked Peltier elements permits a finely apportionable control of the supply of heat into the optical element. As a result, the deflection of the manipulator can be particularly finely apportioned. The application of a fluid flow to the optical element advantageously leads, alongside the application of heat to the optical element, to a purging of the air spaces of the lens of the projection exposure apparatus for microlithography. Contaminants are thereby removed from the lens.

Formulation 4. Method according to either of the preceding Formulations 2 and 3, characterized in that the optical element is discretized into individual cells $x^k$ by a grid described in the form of a vector $x=(x^k)$, and the temperature at the instant $t_i$ of the cells $x^k$ is part of the record in the form of the vector $x_{t_i}=(x_{t_i}^k)$ at instants $t_i$.

By means of Using the method according to Formulation 4, a discretized temperature distribution of the optical element becomes part of the record according to Formulation 2 or Formulation 3. In the individual cells $x^k$ of the grid, the temperature is assumed to be spatially constant. The spatial temperature distribution of the optical element is thereby recorded by the vector $x_{t_i}$ at an instant $t_i$. Modulo the choice of discretization, all necessary data for determining the optical effect of the manipulator are present as a result. In this case, the record is taken to mean either, as a first variant, the listing of all temperature distributions at already past instants $t_j \leq t_i$ or, as a second variant, a recorded record of the state only at a variable instant $t_i$. In this case, the $t_i$ are a finite sequence of monotonically increasing instants.

Formulation 5. Method according to Formulation 4, characterized in that the grid is a Cartesian grid, a polar grid or a grid produced by a finite element method.

The use of a grid adapted to the form of the optical element can be adapted to the form and also to the location of the optical element. By way of example, a Cartesian grid is suitable for a plane plate or a folding mirror. A polar grid is suitable for a lens element arranged in proximity to the pupil in the lens. A grid produced by a finite element method is suitable for optical elements which either have a highly irregular form or in which great spatial gradients of the temperature distribution are expected during the operation of the projection exposure apparatus. Particularly in the case of a grid produced according to the finite element method, the possibility is afforded of the grid taking account of changing requirements with regard to the regulation of the thermal manipulator by virtue of the grid being spatially locally changed, such that a more precise resolution of the temperature of the optical elements is possible in regions which give reason to expect great thermal gradients during the operation of the projection exposure apparatus for microlithography.

Formulation 6. Method according to Formulation 5, characterized in that a start value of the record, comprising temperature of the cells $x_{t_0}$ at a start time $t_0$, is taken as a basis, and the record of the temperatures of the cells $x_{t_{i+1}}$ at the instant $t_{i+1}$ is continued by (a) the product of the temperatures of the cells $x_{t_i}$ at the instant $t_i$ with a first transition matrix A, which describes the heat flow between the cells from the instant $t_i$ until the instant $t_{i+1}$, and (b) an additional addition of the product of the temperatures of the cells $x_{t_n}$ at the instant $t_n$ with a second transition matrix B, which describes the change in temperature caused by the manipulator in the cells from the instant $t_i$ until the instant $t_{i+1}$.

In the method according to Formulation 6, a start distribution of the temperatures of the cells $x_{t_0}$ is taken as a basis. Until the instant when for the first time the manipulator is deflected and heat is applied to the optical element, the heat flow in the optical element is described by a transition matrix A, which describes, at predefined, discrete times $t_i$, the heat flow within the optical element until the time $t_{i+1}$. The matrix A is dependent on the discretization x of the optical element and on the time duration $t_{i+1}-t_i$ as parameters. Therefore, the following holds true: $A=A(x,t_{i+1}-t_i)$. If a heat input by the manipulator into the optical element takes place, then this gives rise to an additional additive term of the temperature distribution in the optical element. The term is formed by the product of a second transition matrix B with the present temperature distribution $x_{t_i}$ at the instant $t_i$. The temperature distribution caused by the manipulator in the optical element is likewise dependent on the parameters of the discretization x and the time duration of the application of heat $t_{i+1}-t_i$. Therefore, $B=B(x,t_{i+1}-t_i)$ also holds true here. In both cases, a locally constant heat capacity—which in particular is independent of the temperature of the cell—of an individual cell $x^k$ from x is taken as a basis. Using the method according to Formulation 6, both the propagation of the heat input by the manipulator in the optical element and new inputs of heat into the optical element by the manipulator are linearized both spatially and temporally via the transition matrices A and B. Formally, the temperature distribution at the instant $t_{i+1}$ according to Formulation 6 is represented as follows:

$$(*)x_{t_{i+1}} = \begin{cases} A(x, t_{i+1}-t_i)x_{t_i}, & \text{if the manipulator does not input heat into the optical element at the instant } t_i \\ A(x, t_{i+1}-t_i)x_{t_i} + & \text{if heat is input into the optical element} \\ B(x, t_{i+1}-t_i)x_{t_i}, & \text{by the manipulator at the instant } t_i \end{cases}$$

The $A(x,t_{i+1}-t_i)$ are dimensionless transition matrices which describe the heat flow between the cells from x after a time duration $t_{i+1}-t_i$ to a linear approximation. More precisely, the product $A_{kl}(x,t_{i+1}-t_i)x_{t_i}^l$ describes the temperature in the cell $x^l$ which arises on account of the heat flow from the cell $x^l$ into the cell $x^l$ in the time period from $t_i$ to $t_{i+1}$. In this case, the heat flow and the temperature of the two cells are assumed to be constant in this time period, and the heat flow is assumed to be independent of the instant $t_i$ at which it begins. Correspondingly, the $B(x,t_{i+1}-t_i)$ are dimensionless transition matrices which describe the heat input of the manipulator during a time duration into the individual cells from x after a time duration $t_{i+1}-t_i$ to a linear approximation. In this case, the transition matrices are determined from an analytical or numerical calculation, such as, for example, the finite element method, and a solution obtained thereby to the heat conduction equation for the optical element.

Formulation 7. Method according to Formulation 6, characterized in that $x_{t_{n+1}}^k=0$ is set if $$x_{t_{n+1}}^k \leq \delta \max_l x_{t_{n+1}}^l$$

where $\delta=0.1$, or $\delta=0.5$, or $\delta=0.01$.

Using the method according to Formulation 7, the record of the temperature distribution in the optical element is simplified by setting the temperature $x_{t_{i+1}}^k=0$ if they fall below a predefined value at an instant $t_{i+1}$. In Formulation 7, this is referenced to the value 0, which should be regarded merely as a limit to be fixed beforehand for a nominal temperature of the optical element. This advantageously saves computation time when determining the new temperature distribution at the instant $t_{i+1}$ according to Formulation 6.

Formulation 8. Method according to any of Formulations 4 to 7, characterized in that the instants $t_i$ are equidistant with $t1=t_{i+1}-t_i$ and the transition matrices from Formulation 10 are time-independent.

A time-independent formulation of the transition matrices $A=A(x)$ and $B=B(x)$ according to Formulation 8 requires less memory space than if a plurality of transition matrices have to be kept available for time periods of different lengths.

Formulation 9. Method according to any of Formulations 4 to 8, characterized in that the instants $t_{i_j}$ at which heat is input by the manipulator are equidistant with $t2=t_{i_{j+1}}-t_{i_j}$ and the record is only changed at times $t_{i_j}$ of heat input by the manipulator.

If the instants $t_{i_j}$ at which heat is input by the manipulator are equidistant, then the calculation from (*) can be simplified by $$(*')x_{t_{n_{j+1}}} = A(x)^{n_{j+1}-n_j} x_{t_{n_j}} + B(x)x$$

since the record has to be calculated anew only at times of heat input by the manipulator.

Formulation 10. Method according to Formulation 4 or Formulation 5, characterized in that the heat inputs $x_{t_i}$ by the manipulator into the cells are recorded at the instants $t_j$, the optical effects $z_{t_i}$ of the heat inputs $x_{t_i}$ at the instants $t_i$ are calculated, and the total optical effect $z_{t_n}$ of the heat inputs $x_{t_i}$ at an instant $t_n$ is calculated by a weighted sum $$\sum_{t_i \leq t_n} \alpha_{t_i} z_{t_i}.$$

The method according to Formulation 10 presents an alternative method to Formulation 6 for recording the effects of the manipulator. According to Formulation 10, there is no need for transition matrices describing the general temperature development in the optical element. Only the heat inputs caused by the manipulator are recorded and their optical effects are calculated. On account of the non-linearity explained above, the optical effect established at a given instant on account of these collective heat inputs should be determined as a cumulative effect of the individual heat inputs. For this purpose, a weighted sum is established according to Formulation 10. In this case, the parameters $\alpha_{t_i}$ are determined from an analytical or numerical calculation, such as, for example, the finite element method, and a solution obtained thereby to the heat conduction equation for the optical element.

Formulation 11. Method according to Formulation 10 characterized in that the weights $\alpha_{t_i}$ form an exponentially falling sequence, in particular $$\alpha_{t_j} = \exp\beta(t_0 - t_j) \bigg/ \sum_{0 \leq i \leq j} \exp\beta(t_j - t_0)$$

for a suitably selected $\beta > 0$.

In the method according to Formulation 11, the weights $\alpha_{t_j}$ according to Formulation 10 are established by an exponentially falling sequence summing to 1. In this case, the parameter $\beta > 0$ is specific to the optical element and can be determined by numerical simulation or measurement and can be calibrated by measuring the temperature of the optical element.

Formulation 12. Method according to Formulation 10 characterized in that $\alpha_{t_i} = 0$ is set for values $$\alpha_{t_j} \leq \delta \max_j \alpha_{t_j}$$

where $\delta = 0.1$, or $\delta = 0.5$, or $\delta = 0.01$.

The same saving as in the case of the method according to Formulation 7 is analogously obtained in the method according to Formulation 12, except that here temporal rather than spatial weights are set to 0. Accordingly, heat inputs by the manipulator which are far in the past as seen relative to other heat inputs are considered to have decayed and, therefore, the corresponding coefficient is set to 0.0.

Formulation 13. Method according to any of the preceding formulations, characterized in that the optical effect of the manipulator at a predefined instant is determined from the effect of the manipulator together with the recorded history of the effects of the manipulator.

In the method according to Formulation 13, the optical effect of the non-linear or non forgetting manipulator is determined on the basis of the recorded history thereof. As a result, in parallel with the sensitivities naturally provided for linear manipulators, this can be used for adjusting the lens or the projection exposure apparatus for microlithography. This optical effect serves as a replacement for a sensitivity during adjustment if the combination of non-linearity of the manipulator and desired maximum deflection prohibits the definition of such a sensitivity.

Formulation 14. Method according to Formulation 13 and any of the preceding Formulations 6 to 9, characterized in that the optical effect of a heat input at an instant $t_i$ by the manipulator for a time duration $t_{i+1} - t_i$ is calculated by the optical effect of the difference between the temperature distributions $x_{t_{i+1}} - x_{t_i}$.

In the method according to Formulation 14, the optical effect of the difference between the temperature distributions is calculated as an analog of the optical effect from Formulation 13.

Formulation 15. Method for operating a projection exposure apparatus for microlithography, characterized in that the method comprises recording a record according to either of the preceding Formulations 13 to 14, a first image aberration of a lens of the projection exposure apparatus is measured, or simulated, or determined according to a look-up table, and the manipulator inputs heat into the optical element if (a) the optical effect of such a heat input reduces the image aberration or (b) the optical effect of such a heat input changes the image aberration into a second image aberration, which is qualitatively different from the first image aberration.

The method according to Formulation 15 involves calculating an image aberration according to either of Formulations 13 and 14. If a determined first image aberration of the lens of the projection exposure apparatus for microlithography can be reduced by the image aberration, or can be changed into a second image aberration, which is qualitatively different from the image aberration, then the image aberration can either be directly reduced or be reduced by further manipulators that can reduce the second image aberration.

Formulation 16. Method according to either of the preceding formulations, characterized in that the heat input $x_{t_i}$—calculated according to the record—at an instant $t_i$ into the optical element is calibrated by measuring the real heat distribution of the optical element at the instant.

In the method according to Formulation 16, a calibration of the record of the calculated heat inputs takes place using a measurement of the real heat distribution of the optical element. This prevents the real heat distribution and the calculated heat distribution from drifting too far apart from one another, such that a calculation of the optical effect of the manipulator is no longer possible or it no longer relates to the optical effect established in reality. Such a calibration can be performed at regular or irregular intervals. The calibration comprises, at the given instant $t_i$, replacing the inputs of the temperatures of the cells by the measured temperatures instead of the temperatures determined according to Formulation 6. In this case, the manipulator is preferably not deflected during the calibration.

In this case, the lens, before the operation thereof, can be provided with a basic calibration which ensures that the transition matrices from Formulation 6, the parameters $\alpha_{t_i}$ from Formulation 10, or the parameter from Formulation 11 are adapted to the lens.

This basic calibration can be performed with the aid of two or more temperature measurements. Such a basic calibration can be advantageous on account of combinations of different glass compositions, different mirror substrates, or different coating qualities of different optical elements of different lenses.

Formulation 17. Method according to Formulation 16 characterized in that the calibration is performed in a manner taking account of a lens heating model for the heat distribution in the optical element which does not take account of the influencing by the manipulator.

In the method according to Formulation 17, the calibration is performed in a manner taking account of a lens heating model as presented in US20080002167A1, for example, which ensures that the temperature inputs caused by the manipulator can be separated from those brought about by illumination light. This ensures that the record is not corrupted by lens heating contributions.

Formulation 18. Projection exposure apparatus for microlithography, characterized in that the projection exposure apparatus comprises a memory in which the history of the effects of the heat inputs according to any of the preceding claims is recorded.

A projection exposure apparatus for micro lithography according to Formulation 18 is equipped, using a memory, for recording the above-described history of the effect of the heat inputs of the manipulator, and accordingly, benefits from the advantages described above by virtue of the fact that it is suitable for one of the abovementioned methods for operating a projection exposure apparatus for microlithography.

BRIEF DESCRIPTION OF THE DRAWINGS

The invention is illustrated below with reference to figures.

DETAILED DESCRIPTION

Figure 1:
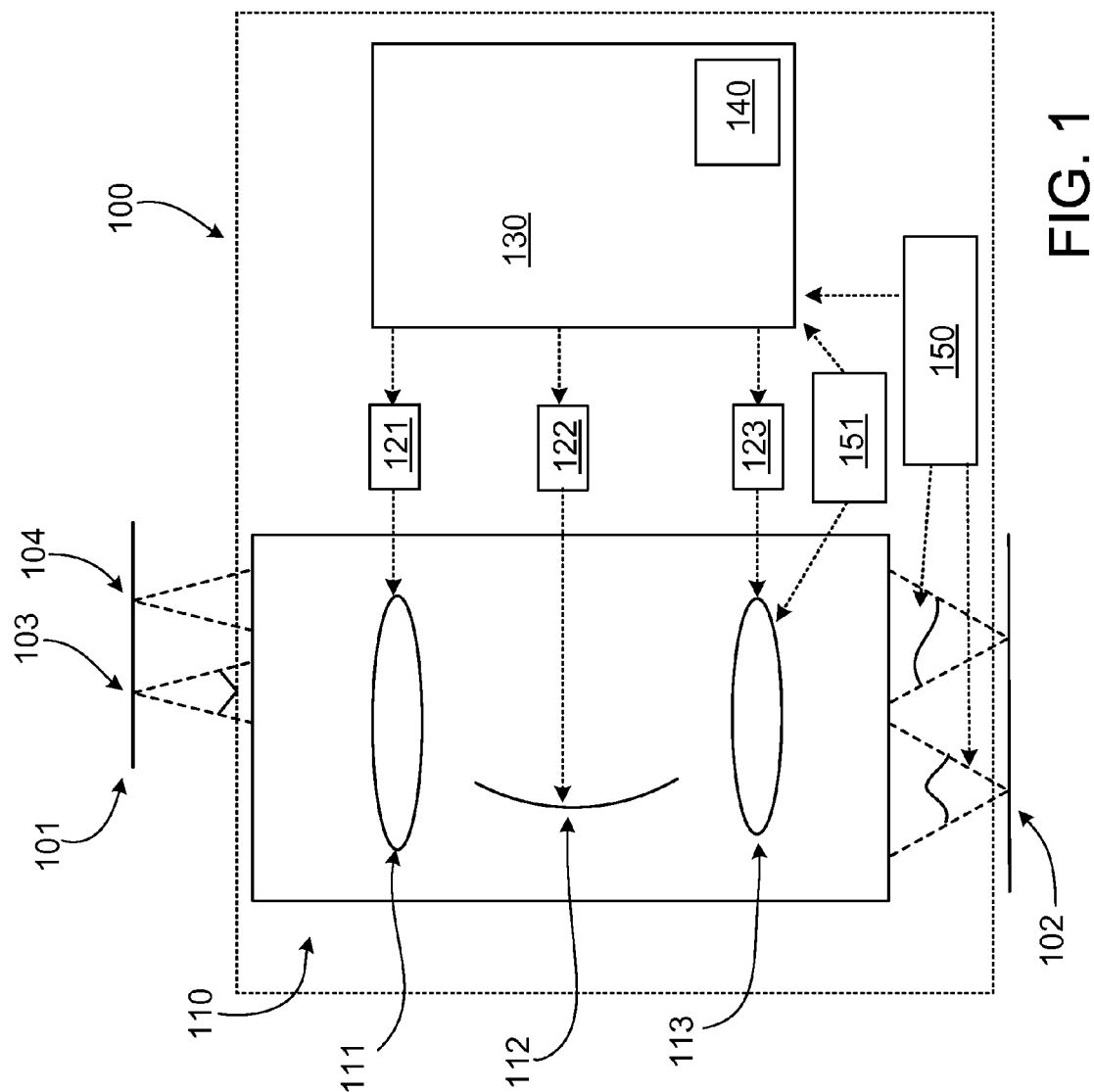
FIG. 1 shows a projection apparatus suitable for carrying out the method according to the invention.

FIG. 1 shows an exemplary embodiment of a projection apparatus 100 for microlithography for imaging an object field 101 onto an image field 102. The projection apparatus 100 contains a projection lens 110, called lens hereinafter. Two field points 103 and 104 situated in the object field are illustrated by way of example, the field points being imaged into the image plane 102 by the lens.

The lens contains optical elements such as lens elements 111, 113, mirrors 112 and, not illustrated here, plane plates. A manipulator 121 acts on one of the lens elements, which manipulator can shift or bend the lens element. Such a manipulator can be regarded as linear and forgetting in the context of its maximum deflections provided. A second manipulator 122 acts on the mirror 112 in the same way. A third manipulator 123 applies heat to a second lens element 113. This can take place via ohmic heat, or infrared light, or heat caused by a Peltier element, or heat caused by a fluid flow, in particular by a gas flow. This changes locally the refractive index and the shape of the lens element and thus locally the optical effect thereof.

With a predefined aperture, maximum light beams delimited by the aperture emerge from the two field points 103 and 104. The outermost rays of the beams are illustrated here in a dashed manner. The outermost rays delimit the wavefronts respectively associated with the field points 103 and 104. For the purpose of illustrating the invention, the wavefronts are assumed to be spherical. A wavefront sensor and/or further sensors and/or a prediction model form(s) a determining unit 150, which yields information about image aberrations or wavefronts after the passage thereof through the lens. The further sensors are, for example, air pressure sensors, sensors for measuring the temperature in the lens or sensors that measure the temperature on lens elements or on the rear side of mirrors. The temperature of the lens element 113, in particular, is measured by a sensor 151.

The manipulators 121, 122, 123 are controlled by a regulating unit 130, which receives data both from the wavefront sensor 150 and from the temperature sensor 151. The regulating unit 130 contains a memory 140, in which the regulating unit 130 records the history of the effects of the manipulator 123 on the lens element 113. In the present case, this consists of the discretized temperature distributions $x_{t_i} = (x_{t_i}^k)$ at the times $t_i$, proceeding from a start distribution $x_{t_0}$ at an instant $t_0$, which can be predefined. By way of example, this temperature distribution $x_{t_0}$ can be obtained from a lens heating model.

Figure 2:
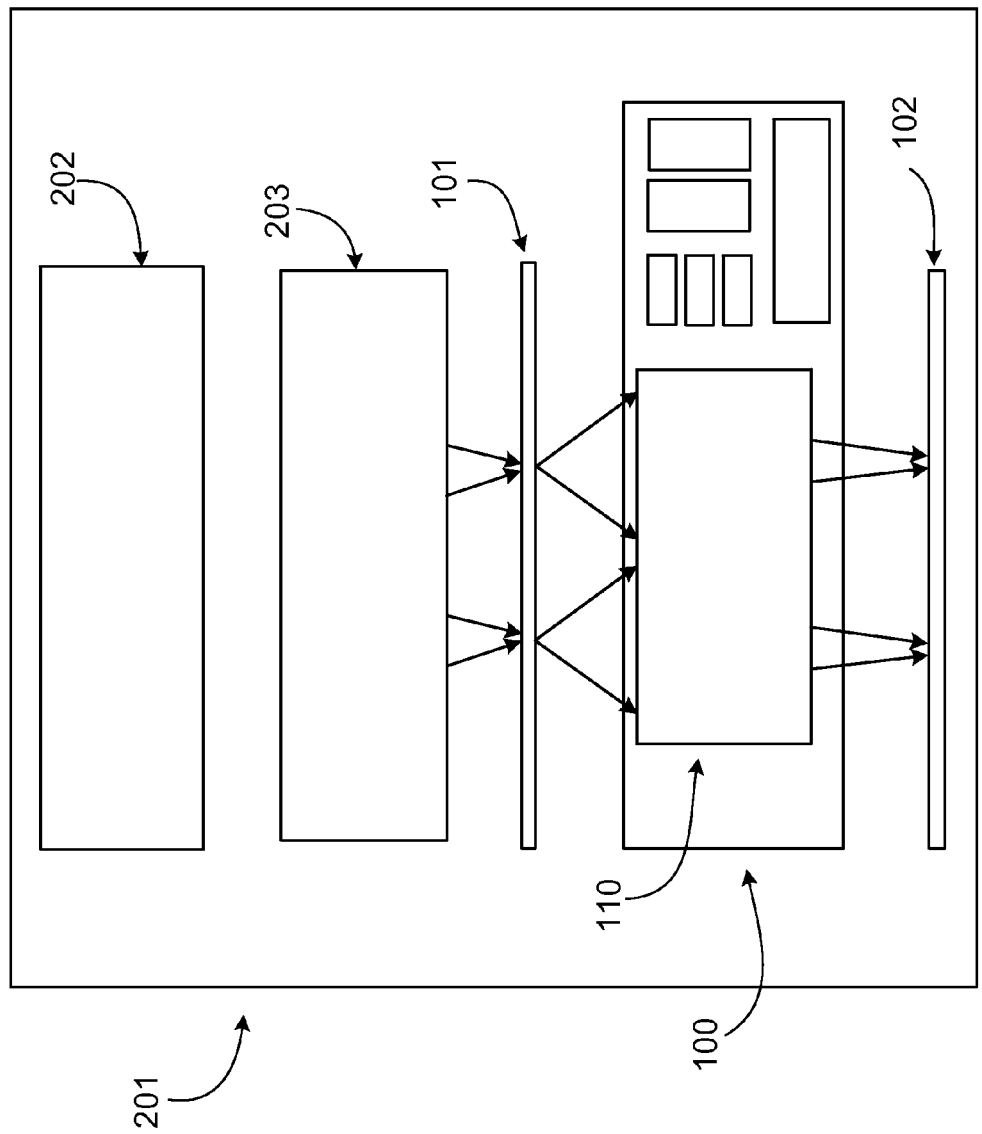
FIG. 2 shows a projection exposure apparatus suitable for carrying out the method according to the invention.

FIG. 2 shows a projection exposure apparatus 201 for microlithography comprising a projection apparatus 100 according to the invention. The projection exposure apparatus consists of a light source, which is generally a laser operating with an operating wavelength of 193 nm or 248 nm. Use is also made of other light sources, such as gas discharge lamps, which naturally supply fewer narrow bandwidths of the operating wavelengths but have pronounced peaks at wavelengths of 365 nm, 405 nm and 435 nm (i-, g- and h-line). The wavelength of 13.5 nm is likewise used with an X-ray source, such as a plasma source LPP or DPP, or a synchrotron source. The course of the illumination light through the projection exposure apparatus is illustrated schematically by arrows. The light leaves the laser 202 without appreciable etendue. The latter is produced by the illumination system 203, which illuminates the reticle 101 with a predefined output-side aperture of the illumination system 203. The illumination setting is also set via the illumination system 203. Use is made of dipole, quadrupole or annular settings and freeform settings, which can be set using a multimirror array, for example.

After traversing the mask, which is generally designed as a binary chromium mask or as a phase shifting mask, the illumination light reaches the projection apparatus 100 according to the invention and the lens 110 therein. The lens is operated with a stop position corresponding to a sigma setting that is optimal for the imaging of the reticle currently used. The sigma setting is defined as the quotient of output-side aperture of the illumination system and input-side aperture of the lens.

During the exposure of a die, upon a change from die to die, upon a change from wafer to wafer, upon a change from reticle to reticle, or upon a change from batch to batch, the image aberrations of the lens are measured by the wavefront sensor 150 and, if one of the image aberrations no longer satisfies a predefined specification, the image aberration is brought to specification again by regulation or control of the manipulators 121, 122, and 123.

Figure 3:
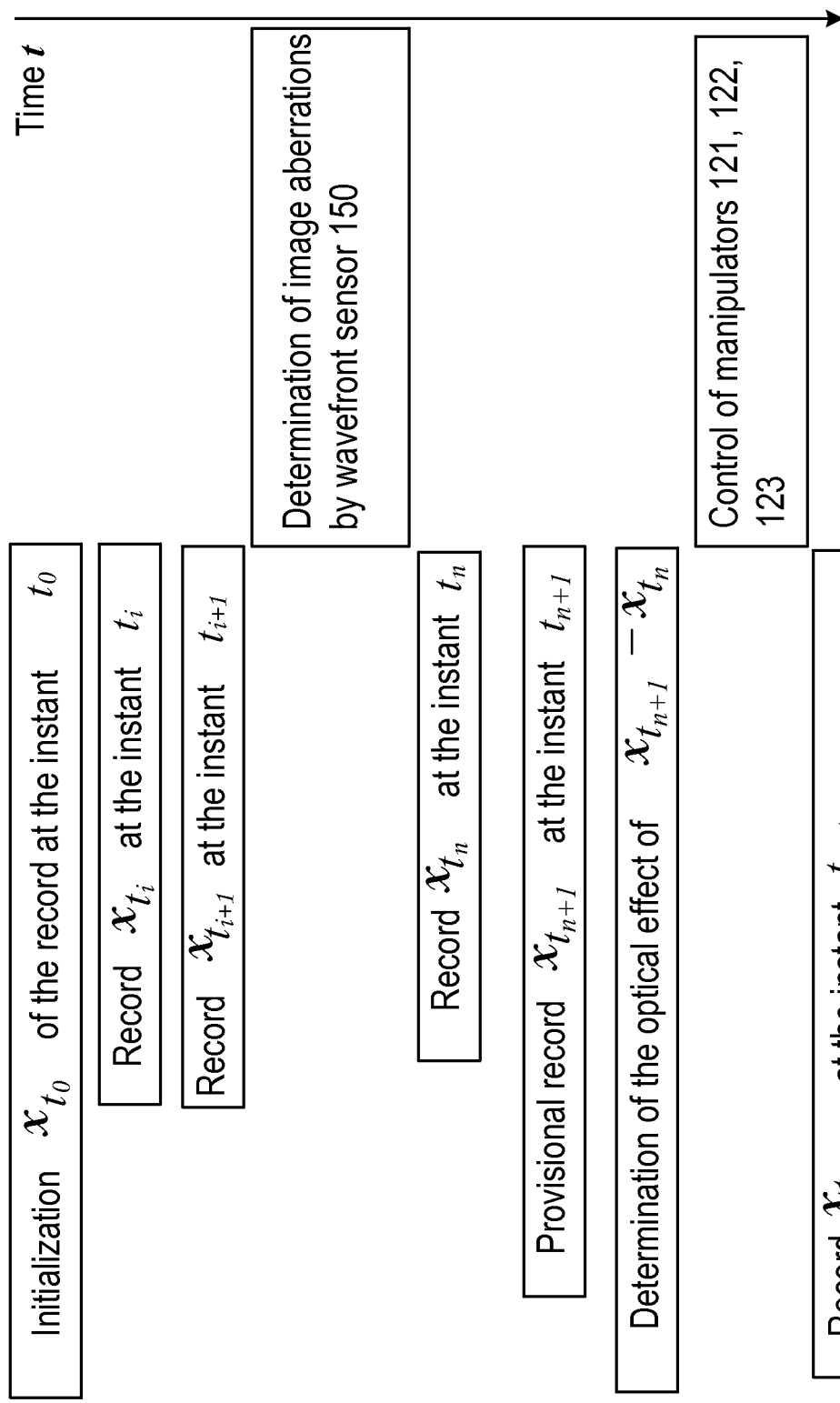
FIG. 3 shows the flowchart of a recording according to the invention of the effects of the non-linear or non-forgetting manipulator.

FIG. 3 shows the temporal sequential flow diagram of a recording according to the invention of the effects of the heat-inputting manipulator 123, and the control of the manipulator 123. The record is initialized with values $x_{t_0}$ at an instant $t_0$. A record $x_{t_i}$ at an instant $t_i$ is inductively taken as a basis, and the record $x_{t_{i+1}}$ at the instant $t_{i+1}$ is determined via the transition matrix A from Formulation 6. At an instant $t_n$ which can then be assumed to be arbitrary, image aberrations which require a manipulation of the lens by the manipulator 123 are determined by the wavefront sensor 150. Using the transition matrices A and B according to Formulation 6, a provisional record $x_{t_{n+1}}$ can be determined for an assumed deflection of the manipulator 123. The optical effects of the temperature distribution which correspond to the record of $x_{t_{n+1}} - x_{t_n}$ are subsequently determined, which corresponds to the optical effects of the assumed deflection of the manipulator 123, starting at the instant $t_n$, calculated at the instant $t_{n+1}$. If the optical effect corresponds to a predefined desired optical effect (not illustrated here), then the manipulator 123 is deflected in accordance with the assumed deflection and the provisional record $x_{t_{n+1}}$ is continued. If the optical effect does not correspond to the predefined optical effect, by contrast, then an alternative deflection (likewise not illustrated here) of the manipulator 123 is assumed and an alternative provisional record $x'_{t_{n+1}}$ (not illustrated here) is determined. This procedure is conducted iteratively until the desired optical effect can be determined or until a termination criterion (not illustrated here) is reached.

Figure 4:
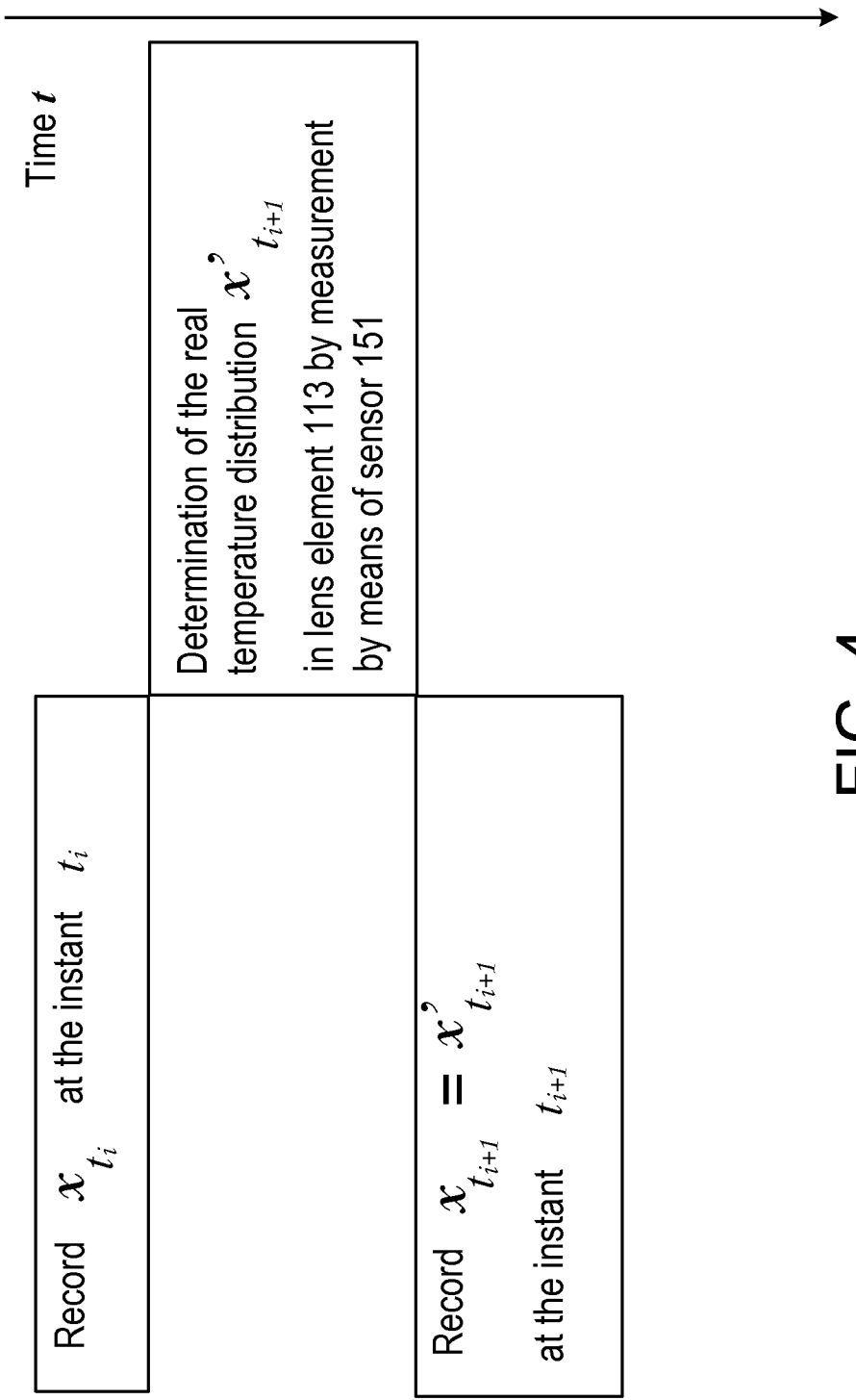
FIG. 4 shows the flowchart of a calibration of the recording according to the invention.

FIG. 4 shows the sequential flow diagram of a calibration according to Formulation 16 of the recording according to the invention according to Formulation 6. The record $x_{t_i}$ of an arbitrarily selectable instant $t_i$ is not continued by the record $x_{t_{i+1}}$ according to Formulation 6, but rather replaced at the instant $t_{n+1}$ by a record $x'_{t_{n+1}}$ of a record $x'_{t_{n+1}}$ determined on a real measurement of the temperature of the lens element 113 by the temperature sensor 151.

What is claimed is:

1. A method of operating a projection exposure apparatus for microlithography which comprises an optical element and a manipulator, the method comprising:
   using the manipulator to act on the optical element; and
   recording a history of the effects of the manipulator in a record,
   wherein the manipulator is a non-linear manipulator or a non-forgetting manipulator, and
   wherein:
      the optical element is discretized into individual cells $x^k$ by a grid described in the form of a vector; and
      the temperature at the instant $t_i$ of the cells $x^k$ is part of the record in the form of the vector $x_{t_i} = (x_{t_i}^k)$ at the instant $t_i$.

2. The method of claim 1, wherein the optical effect of the manipulator at a predefined instant is determined from the effect of the manipulator together with the recorded history of the effects of the manipulator.

3. The method of claim 2, wherein the optical effect of a heat input at an instant $t_i$ by the manipulator for a time duration $t_{i+1} - t_i$ is calculated by the optical effect of the difference between the temperature distributions $x_{t_{i+1}} - x_{t_i}$.

4. The method of claim 2, further comprising:
   measuring, simulating or determining via a look-up table a first image aberration of an imaging system of the projection exposure apparatus; and
   using the manipulator to input heat into the optical element when the optical effect of the heat input reduces the first image aberration or changes it into a second image aberration, which is qualitatively different from the first image aberration.

5. The method of claim 4, wherein the manipulator changes the first image aberration into a second image aberration which is qualitatively different from the first image aberration and which is subsequently or simultaneously reduced during this change by linear or forgetting manipulators.

6. The method of claim 1, wherein the heat input $x_{t_i}$, calculated according to the record, at an instant $t_i$ into the optical element is calibrated by measuring the real heat distribution of the optical element at the instant.

7. The method of claim 6, wherein the calibration takes account of a lens heating model for the heat distribution in the optical element which does not take account of the influencing by the manipulator.

8. A method of operating a projection exposure apparatus for microlithography which comprises an optical element and a manipulator, the method comprising:
   using the manipulator to change a temperature of the optical element, the deflection of which brings about a heat flow into the optical element; and
   recording a history of the effects of the manipulator in a record, wherein:
      the optical element is discretized into individual cells $x^k$ by a grid described in the form of a vector; and
      the temperature at the instant $t_i$ of the cells $x^k$ is part of the record in the form of the vector $x_{t_i} = (x_{t_i}^k)$ at the instant $t_i$.

9. The method of claim 8, wherein the grid is a Cartesian grid, a polar grid or a grid produced by a finite element method.

10. The method of claim 9, wherein:
   a start value of the record, including temperature of the cells $x_{t_0}$ at a start time $t_0$, is taken as a basis; and
   the record of the temperatures of the cells $x_{t_{i+1}}$ at the instant $t_{i+1}$ is continued by
   (a) the product of the temperatures of the cells $x_{t_i}$ at the instant $t_i$ with a first transition matrix A, which describes the heat flow between the cells from the instant $t_i$ until the instant $t_{i+1}$; and
   (b) an additional addition of the product of the temperatures of the cells $x_{t_i}$ at the instant $t_i$ with a second transition matrix B, which describes the change in temperature caused by the manipulator in the cells from the instant $t_i$ until the instant $t_{i+1}$.

11. The method of claim 10, wherein $x_{t_{n+1}}^k = 0$ is set if $x_{t_{n+1}}^k \leq \delta$ $$x_{t_{n+1}}^k = 0 \text{ is set if } x_{t_{n+1}}^k \leq \delta \max_l x_{t_{n+1}}^l$$

where $\delta = 0.1$, or $\delta = 0.5$, or $\delta = 0.01$.

12. The method of claim 10, wherein the instants $t_i$ are equidistant with $t1 = t_{i+1} - t_i$ and the transition matrices are time-independent.

13. The method of claim 8, wherein the instants $t_{i_j}$ at which heat is input by the manipulator are equidistant with $t2 = t_{i_{j+1}} - t_{i_j}$, the record is changed only at times $t_{i_j}$ of heat input by the manipulator.

14. The method of claim 8, wherein:
   the heat inputs $x_{t_i}$ by the manipulator into the cells are recorded at the instants $t_i$;
   the individual optical effects $z_{t_i}$ of the heat inputs $x_{t_i}$ at the instants $t_i$ are calculated; and
   the total optical effect $z_{t_n}$ of the heat inputs $x_{t_i}$ at an instant $t_n$ is calculated by a weighted sum $$\sum_{t_i \leq t_n} \alpha_{t_i} z_{t_i}.$$

15. The method of claim 14, wherein the weights $a_{t_i}$ form an exponentially falling sequence.

16. The method of claim 15, wherein:
$a_{t_i}=0$ is set for values $\alpha_{t_i} \leq \delta$ $$\alpha_{t_i} \leq \delta \max_{j} \alpha_{t_i}$$

where $\delta=0.1$, or $\delta=0.5$, or $\delta=0.01$.

* * * * *